(12) United States Patent
McGivney et al.

(10) Patent No.: US 10,877,120 B2
(45) Date of Patent: Dec. 29, 2020

(54) SYSTEM AND METHOD FOR VISUALIZATION AND SEGMENTATION OF TISSUE USING A BAYESIAN ESTIMATION OF MULTICOMPONENT RELAXATION VALUES IN MAGNETIC RESONANCE FINGERPRINTING

(71) Applicant: Case Western Reserve University, Cleveland, OH (US)

(72) Inventors: Debra McGivney, Bay Village, OH (US); Mark A. Griswold, Shaker Heights, OH (US)

(73) Assignee: Case Western Reserve University, Cleveland, OH (US)

( * ) Notice: Subject to any disclaimer, the term of this patent is extended or adjusted under 35 U.S.C. 154(b) by 72 days.

(21) Appl. No.: 16/416,666

(22) Filed: May 20, 2019

(65) Prior Publication Data
US 2019/0353732 A1 Nov. 21, 2019

Related U.S. Application Data

(60) Provisional application No. 62/673,822, filed on May 18, 2018.

(51) Int. Cl.
*G01R 33/50* (2006.01)
*G01R 33/56* (2006.01)
*G01R 33/54* (2006.01)

(52) U.S. Cl.
CPC .......... *G01R 33/50* (2013.01); *G01R 33/543* (2013.01); *G01R 33/5608* (2013.01)

(58) Field of Classification Search
CPC .. G01R 33/448; G01R 33/4828; G01R 33/50; G01R 33/543; G01R 33/56; G01R 33/5602; G01R 33/5608
See application file for complete search history.

(56) References Cited

U.S. PATENT DOCUMENTS

| | | | |
|---|---|---|---|
| 8,643,363 B2 * | 2/2014 | Warntjes | G01R 33/56 324/309 |
| 8,723,518 B2 | 5/2014 | Seiberlich | |

(Continued)

OTHER PUBLICATIONS

Badve, C. et al. MR fingerprinting of adult brain tumors: Initial experience. Am. J. Neuroradiol. 38, 492-499 (2017).

(Continued)

*Primary Examiner* — Steven L Yeninas
(74) *Attorney, Agent, or Firm* — Quarles & Brady LLP

(57) ABSTRACT

A method for magnetic resonance fingerprinting (MRF), including accessing MRF data and a dictionary of signal evolutions. A plurality of regions-of-interest (ROIs) are selected in the MRF data. A first series of tissue parameter estimates is generated from the MRF data in the ROIs using the dictionary and a multicomponent Bayesian framework. From the first series of tissue parameter estimates, probability distributions are computed for different tissue types. The method further includes creating a reduced dictionary by removing entries from the dictionary having tissue parameter values not contained within the computed probability distributions. A second series of tissue parameter estimates is generated from the MRF data using the reduced dictionary and a multicomponent Bayesian framework. The method also includes generating a tissue probability map for each different tissue type from the second series of tissue parameter estimates.

14 Claims, 4 Drawing Sheets

(56) References Cited

U.S. PATENT DOCUMENTS

| | | | | |
|---|---|---|---|---|
| 2013/0265047 | A1* | 10/2013 | Griswold | G01R 33/56 |
| | | | | 324/309 |
| 2014/0167754 | A1* | 6/2014 | Jerecic | G01R 33/56 |
| | | | | 324/309 |
| 2015/0301141 | A1* | 10/2015 | Griswold | G01R 33/5608 |
| | | | | 382/131 |
| 2016/0170065 | A1* | 6/2016 | Jain | G01V 3/14 |
| | | | | 324/303 |
| 2019/0025280 | A1* | 1/2019 | Kaditz | G16H 30/20 |
| 2019/0025392 | A1* | 1/2019 | Chen | A61B 5/7267 |
| 2019/0066297 | A1* | 2/2019 | Middlebrooks | G06T 7/0016 |
| 2019/0102516 | A1* | 4/2019 | Schieke | G16H 30/40 |

OTHER PUBLICATIONS

Jiang, Y., et al. MR fingerprinting using fast imaging with steady state precession (FISP) with spiral readout. Magn. Reson. Med. 74, 1621-1631 (2015).

Ma, D. et al. Magnetic resonance fingerprinting. Nature 495, 187-192 (2013).

McGivney, D., et al. "Bayesian estimation of multicomponent relaxation parameters in magnetic resonance fingerprinting." Magnetic resonance in medicine 80.1 (2018): 159-170.

* cited by examiner

SYSTEM AND METHOD FOR VISUALIZATION AND SEGMENTATION OF TISSUE USING A BAYESIAN ESTIMATION OF MULTICOMPONENT RELAXATION VALUES IN MAGNETIC RESONANCE FINGERPRINTING

CROSS-REFERENCE TO RELATED APPLICATIONS

This application claims the benefit of U.S. Provisional Patent Application Ser. No. 62/673,822, filed on May 18, 2018, and entitled "System and Method for Visualization and Segmentation of Tissue Using a Bayesian Estimation of Multicomponent Relaxation Values in Magnetic Resonance Fingerprinting," which is herein incorporated by reference in its entirety.

STATEMENT REGARDING FEDERALLY SPONSORED RESEARCH

This invention was made with government support under EB016728 and EB017219 awarded by the National Institutes of Health. The government has certain rights in the invention.

BACKGROUND

Characterizing tissue species using nuclear magnetic resonance ("NMR") can include identifying different properties of a resonant species (e.g., T1 spin-lattice relaxation, T2 spin-spin relaxation, proton density). Other properties like tissue types and super-position of attributes can also be identified using NMR signals. These properties and others may be identified simultaneously using magnetic resonance fingerprinting ("MRF"), which is described, as one example, by D. Ma, et al., in "Magnetic Resonance Fingerprinting," Nature, 2013; 495 (7440): 187-192.

Conventional magnetic resonance imaging ("MRI") pulse sequences include repetitive similar preparation phases, waiting phases, and acquisition phases that serially produce signals from which images can be made. The preparation phase determines when a signal can be acquired and determines the properties of the acquired signal. For example, a first pulse sequence may produce a T1-weighted signal at a first echo time ("TE"), while a second pulse sequence may produce a T2-weighted signal at a second TE. These conventional pulse sequences typically provide qualitative results where data are acquired with various weightings or contrasts that highlight a particular parameter (e.g., T1 relaxation, T2 relaxation).

When magnetic resonance ("MR") images are generated, they may be viewed by a radiologist and/or surgeon who interprets the qualitative images for specific disease signatures. The radiologist may examine multiple image types (e.g., T1-weighted, T2-weighted) acquired in multiple imaging planes to make a diagnosis. The radiologist or other individual examining the qualitative images may need particular skill to be able to assess changes from session to session, from machine to machine, and from machine configuration to machine configuration.

Unlike conventional MRI, MRF employs a series of varied sequence blocks that simultaneously produce different signal evolutions in different resonant species (e.g., tissues) to which the radio frequency ("RF") is applied. The signals from different resonant tissues will, however, be different and can be distinguished using MRF. The different signals can be collected over a period of time to identify a signal evolution for the volume. Resonant species in the volume can then be characterized by comparing the signal evolution to known evolutions. Characterizing the resonant species may include identifying a material or tissue type, or may include identifying MR parameters associated with the resonant species. The "known" evolutions may be, for example, simulated evolutions calculated from physical principles and/or previously acquired evolutions. A large set of known evolutions may be stored in a dictionary.

SUMMARY OF THE DISCLOSURE

The present disclosure addresses the aforementioned drawbacks by providing a method for generating tissue probability maps using magnetic resonance fingerprinting ("MRF"). MRF data and a dictionary are accessed with a computer system. The MRF data were acquired from a volume in a subject using an MRI system, and the dictionary contains a plurality of signal evolutions. A plurality of regions-of-interest (ROIs) in the MRF data are selected. Each ROI corresponds to a different tissue type. A first series of tissue parameter estimates is generated by inputting the dictionary and the MRF data contained in the plurality of ROIs to a multicomponent Bayesian framework, generating output as tissue parameter estimates for each ROI. A probability distribution is computed for each different tissue type from the first series of tissue parameter estimates. A reduced dictionary is created by removing entries from the dictionary having tissue parameter values not contained within the computed probability distributions. A second series of tissue parameter estimates is generated by inputting the reduced dictionary and the MRF data to a multicomponent Bayesian framework, generating output as tissue parameter estimates for each voxel in the volume. A tissue probability map is generated for each different tissue type from the second series of tissue parameter estimates.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Figure 1:
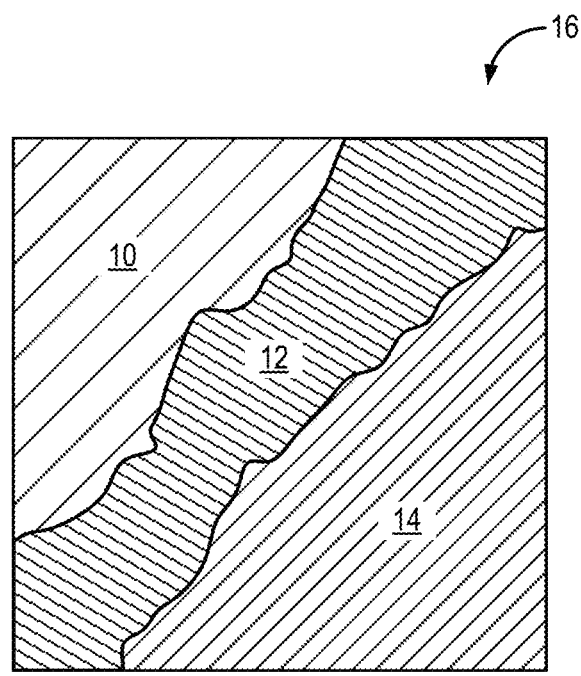
FIG. 1 shows a schematic of a mixed signal voxel with slowly or non-exchanging components (e.g., different tissue types), with distinct boundaries.

Described here are methods for generating tissue probability maps using magnetic resonance fingerprinting ("MRF"). In general, a multicomponent Bayesian framework is implemented to estimate tissue parameters in select regions-of-interest (e.g., one or only a few voxels each) corresponding to particular tissue types. The output of this ROI-based analysis is used to compute probability distributions that inform the creation of a reduced dictionary that can then be efficiently utilized to estimate tissue parameters across an image slice or volume. For instance, a multicomponent Bayesian framework can again be used, but in this instance with the reduced dictionary, in order to separate signal contributions from different tissue types in mixed signal voxels.

Magnetic resonance fingerprinting ("MRF") is a technique that facilitates mapping of tissue or other material properties based on random or pseudorandom measurements of the subject or object being imaged. In particular, MRF can be conceptualized as employing a series of varied "sequence blocks" that simultaneously produce different signal evolutions in different "resonant species" to which the RF is applied. The term "resonant species," as used herein, refers to a material, such as water, fat, bone, muscle, soft tissue, and the like, that can be made to resonate using NMR. By way of illustration, when radio frequency ("RF") energy is applied to a volume that has both bone and muscle tissue, then both the bone and muscle tissue will produce a nuclear magnetic resonance ("NMR") signal; however, the "bone signal" represents a first resonant species and the "muscle signal" represents a second resonant species, and thus the two signals will be different. These different signals from different species can be collected simultaneously over a period of time to collect an overall "signal evolution" for the volume.

The random or pseudorandom measurements obtained in MRF techniques are achieved by varying the acquisition parameters from one repetition time ("TR") period to the next, which creates a time series of signals with varying contrast. Examples of acquisition parameters that can be varied include flip angle ("FA"), RF pulse phase, TR, echo time ("TE'), and sampling patterns, such as by modifying one or more readout encoding gradients. The acquisition parameters are varied in a random manner, pseudorandom manner, or other manner that results in signals from different materials or tissues to be spatially incoherent, temporally incoherent, or both. For example, in some instances, the acquisition parameters can be varied according to a non-random or non-pseudorandom pattern that otherwise results in signals from different materials or tissues to be spatially incoherent, temporally incoherent, or both.

From these measurements, which as mentioned above may be random or pseudorandom, or may contain signals from different materials or tissues that are spatially incoherent, temporally incoherent, or both, MRF processes can be designed to map any of a wide variety of parameters. Examples of such parameters that can be mapped may include, but are not limited to, longitudinal relaxation time ($T_1$), transverse relaxation time ($T_2$), main or static magnetic field map ($B_0$), and proton density ($\rho$). MRF is generally described in U.S. Pat. Nos. 8,723,518 and 10,261,154, each of which is incorporated herein by reference in its entirety.

The data acquired with MRF techniques are compared with a dictionary of signal models, or templates, that have been generated for different acquisition parameters from magnetic resonance signal models, such as Bloch equation-based physics simulations. This comparison allows estimation of the physical parameters, such as those mentioned above. As an example, the comparison of the acquired signals to a dictionary can be performed using any suitable matching or pattern recognition technique. The parameters for the tissue or other material in a given voxel are estimated to be the values that provide the best signal template matching. For instance, the comparison of the acquired data with the dictionary can result in the selection of a signal vector, which may constitute a weighted combination of signal vectors, from the dictionary that best corresponds to the observed signal evolution. The selected signal vector includes values for multiple different quantitative parameters, which can be extracted from the selected signal vector and used to generate the relevant quantitative parameter maps.

The stored signals and information derived from reference signal evolutions may be associated with a potentially very large data space. The data space for signal evolutions can be partially described by:

$$SE = \sum_{s=1}^{N_S} \prod_{i=1}^{N_A} \sum_{j=1}^{N_{RF}} R_i(\alpha) R_{RF_{ij}}(\alpha, \phi) R(G) E_i(T_1, T_2, D) M_0; \quad (1)$$

where SE is a signal evolution; $N_S$ is a number of spins; $N_A$ is a number of sequence blocks; $N_{RF}$ is a number of RF pulses in a sequence block; $\alpha$ is a flip angle; $\phi$ is a phase angle; $R_i(\alpha)$ is a rotation due to off resonance; $R_{RF_{ij}}(\alpha,\phi)$ is a rotation due to RF differences; $R(G)$ is a rotation due to a magnetic field gradient; $T_1$ is a longitudinal, or spin-lattice, relaxation time; $T_2$ is a transverse, or spin-spin, relaxation time; D is diffusion relaxation; $E_i(T_1,T_2,D)$ is a signal decay due to relaxation differences; and $M_0$ is the magnetization in the default or natural alignment to which spins align when placed in the main magnetic field.

While $E_i(T_1,T_2, D)$ is provided as an example, in different situations, the decay term, $E_i(T_1,T_2,D)$, may also include additional terms, $E_i(T_1,T_2, D, \ldots)$ or may include fewer terms, such as by not including the diffusion relaxation, as $E_i(T_1, T_2)$ or $E_i(T_1,T_2, \ldots)$. Also, the summation on "j" could be replace by a product on "j".

The dictionary may store signals described by, $$S_i = R_i E_i(S_{i-1}) \quad (2);$$

where $S_0$ is the default, or equilibrium, magnetization; $S_i$ is a vector that represents the different components of magnetization, $M_x$, $M_y$, and $M_z$ during the $i^{th}$ acquisition block; $R_i$ is a combination of rotational effects that occur during the $i^{th}$ acquisition block; and $E_i$ is a combination of effects that alter the amount of magnetization in the different states for the $i^{th}$ acquisition block. In this situation, the signal at the $i^{th}$ acquisition block is a function of the previous signal at acquisition block (i.e., the $(i-1)^{th}$ acquisition block). Additionally or alternatively, the dictionary may store signals as a function of the current relaxation and rotation effects and of previous acquisitions. Additionally or alternatively, the dictionary may store signals such that voxels have multiple resonant species or spins, and the effects may be different for every spin within a voxel. Further still, the dictionary may store signals such that voxels may have multiple resonant species or spins, and the effects may be different for spins within a voxel, and thus the signal may be a function of the effects and the previous acquisition blocks.

As described, MRF is capable of producing quantitative maps of tissue parameters (e.g., $T_1$ and $T_2$ relaxation times) using a pseudorandom data acquisition scheme and a pattern-matching algorithm. In MRF, a unique signal time course is generated for each pixel. This time course evolves based on both physiological tissue properties (e.g., T or $T_2$), as well as acquisition parameters (e.g., FA or TR). This signal time course can be referred to as a signal evolution, and each pixel can be matched to an entry in the dictionary. A dictionary can be created using simulations of the Bloch equations to generate signal evolutions with different combinations of tissue properties as inputs. Additionally or alternatively, a dictionary can be created as a collection of possible signal evolutions or time courses calculated using a range of possible tissue property values and knowledge of the quantum physics that govern the signal evolution. Acquired data can be matched to the closest dictionary entry to produce quantitative maps. For instance, upon matching the measured signal evolution/time course to a specific dictionary entry, the tissue properties corresponding to that dictionary entry can be identified. An important criterion in MRF is that spatial incoherence be maintained to help separate signals that are mixed due to undersampling. In other words, signals from various locations should differ from each other, in order to be able to separate them when aliased.

Partial volume effects occur when the voxel size is larger than the physical structures found within a voxel, or when part of a boundary between two tissues is contained within a voxel. In these cases, the corresponding images may exhibit blurring artifacts or an appearance that averages the structures within the voxel. An example of a mixed signal voxel is illustrated in FIG. 1. In this example, sub-voxel components are contained in relatively distinct compartments (10, 12, 14), each of which is smaller than the voxel 16, but larger than the diffusion mixing distance. This type of model represents situations in which there are many cells of individual tissue types present within a single voxel.

MRF is not immune to partial volume effects. For a given voxel that exhibits partial volume effects caused by the presence of more than one tissue type, the match chosen from the dictionary will correspond to an entry that represents a function of several different entries corresponding to the true tissue types found within that voxel. The effective parameter values assigned in these instances will not accurately represent the voxel composition in mixed voxels.

The unique signal evolution structure in MRF offers an opportunity to separate multiple components within a single voxel. A Bayesian methodology for multicomponent analysis in MRF can be used to separate mixed signal evolutions with minimal prior information using a full MRF dictionary of simulated signal evolutions. Advantageously, this approach can enable segmentation of an organ into specific tissue types. In this methodology, the number and type of sub-voxel tissues do not need to be specified in advance, and the resulting output is a distribution of tissue property values to explain the voxel composition, rather than one single set of effective tissue property values.

One challenge with this approach is the increased dimensionality of the solution over the traditional MRF tissue property maps, which makes visualization challenging. Additionally, when two tissues within a voxel have similar relaxation properties, for example, in white matter and gray matter, an approach that uses the full dictionary may not be able to resolve these tissues clearly.

If the dictionary used in MRF is denoted by D, and y is an observed MRF voxel signal, the partial volume problem can be formulated as the solution to the inverse problem, $$y = Dx + e \qquad (3);$$

for a weight vector, x, and a noise term, e. The solution, x, is generally a sparse, or near-sparse, vector with larger weights corresponding to the dictionary entries that contribute most significantly to the mixed voxel signal. In some examples, the weights are allowed to be complex-valued because of the arbitrary phase that may often be observed in MRF acquisitions.

The MRF dictionary can be represented as a t×n matrix, in which t represents the number of time points and n represents the number of parameter combinations or tissue types. The entries in the MRF dictionary may be complex-valued, such that $D \in \mathbb{C}^{t \times n}$. An observed signal, y, can be represented as a weighted sum of a subset of N dictionary entries, $$y = \sum_{i=1}^{N} x_{\lambda_i} d_{\lambda_i}; \qquad (4)$$

for dictionary entries $d_{\lambda_i}$ with weights $x_{\lambda_i}$. When the subset $\Lambda = \{\lambda_1, \ldots, \lambda_N\}$ is known a priori, the weight vector, x, can be found as the solution to a linear least-squares problem. Because the subset, $\Lambda$, is generally unknown, the problem typically needs to be modeled using the full dictionary, as in Eqn. (3), where x is the vector of corresponding weights and e is noise, which may be complex zero-mean Gaussian noise. Solving Eqn. (3) in the least-squares sense can result in a dense solution, which can make it difficult to pick out the few tissue types that have the most significant contributions to the voxel signal.

Using a Bayesian framework for inverse problems, the unknowns in the problem can be modeled as random variables with associated probability density functions. The solution is the posterior density, which can be given by the Bayes' formula, $$(\pi(x|y) \propto \pi(y|x)\pi(x)) \qquad (5);$$

which is in terms of the likelihood and prior probability densities. The posterior density can be explored using sampling techniques, or point estimates, such as the maximum a posteriori or conditional mean estimators.

The likelihood provides the probability of obtaining the observed signals, assuming that the variable x is known. In some instances, the noise can be assumed to be Gaussian with zero mean and constant variance $\sigma^2$, $e \sim N(0, \sigma^2 I)$, and the likelihood density can be given by, $$\pi(y|x) \propto \exp\left(-\frac{1}{2\sigma^2}\|y - Dx\|^2\right). \qquad (6)$$

The prior density encodes any prior knowledge or belief about the weight vector x, where no assumptions are made about the observed data y. As one non-limiting example, the vector x should be sparse, or approximately sparse, with the largest values corresponding to entries that contribute to the mixed signal. In these instances, each weight ($x_j$, j=1, ..., n) can be assumed to be independent and normally distributed with zero mean and variance $\theta_j$, $x_j \sim N(0, \theta_j)$. The prior density in these instances is then, $$\pi(x) = \frac{\det\{T_\theta^{-1/2}\}}{(2\pi)^n} \exp\left(-\frac{1}{2}\|T_\theta^{-1/2}x\|^2\right); \qquad (7)$$

for the covariance matrix, $T_\theta = \text{diag}(\theta_1, \ldots, \theta_n)$. Although a Gaussian density may not generally encourage sparse solutions, the variance does influence the magnitude of random draws from the distribution, as it controls the spread. Hence, for a small variance $\theta_j$, it is more likely that a random draw from $N(0,\theta_j)$ will be close to zero, whereas a larger variance will allow a higher probability of obtaining a larger realization.

When the variance $\theta_j$ (j=1, . . . , n) is presumed to be unknown, it will also be modeled as a random variable. In these instances, each $\theta_j$ can be assumed to be independent and identically distributed, following a Gamma distribution, with shape and scale parameters $\alpha$ and $\beta$, respectively, as follows:

$$\pi(\theta_j) \propto \theta_j^{\alpha-1} \exp\left(-\frac{\theta_j}{\beta}\right). \tag{8}$$

Random draws from a Gamma distribution with properly chosen parameters $\alpha$ and $\beta$ will generally have a higher probability of being small, while still allowing for large outliers. This in turn controls the width of the Gaussian priors placed on $x_j$. The variables $\theta_j$ are generally referred to as hyperpriors. This described technique can sometimes be referred to as a Bayesian compressive sensing, as it provides a way to find a sparse solution in the Bayesian framework.

The joint probability density of the unknowns can be written in terms of the conditional density as, $$\pi(x,\theta) = \pi(x|\theta)\pi(\theta) \tag{9}.$$

The posterior density, which is the solution to the inverse problem in the Bayesian framework, is proportional to the likelihood, prior, and hyperprior densities, and can be given through Bayes' formula as, $$\pi(x,\theta|y) \propto \pi(y|x)\pi(x|\theta)\lambda(\theta) \tag{10}.$$

Therefore, the posterior density in the examples described above is, $$\pi(x, \theta \mid y) \propto \tag{11}$$
$$\exp\left(-\frac{1}{2\sigma^2}\|y - Dx\|^2 - \frac{1}{2}\|T_\theta^{-1/2}x\|^2 - \frac{1}{\beta}\sum_{j=1}^{n}\theta_j + \left(\alpha - \frac{3}{2}\right)\sum_{j=1}^{n}\log\theta_j\right).$$

The function to be minimized can be formulated by taking the negative logarithm of Eqn. (11) as follows:

$$\operatorname*{argmin}_{x,\theta}\left\{\frac{1}{2\sigma^2}\|y - Dx\|^2 + \frac{1}{2}\|T_\theta^{-1/2}x\|^2 + \frac{1}{\beta}\sum_{j=1}^{n}\theta_j - \left(\alpha - \frac{3}{2}\right)\sum_{j=1}^{n}\log\theta_j\right\}. \tag{12}$$

As one non-limiting example, to obtain a point estimate for the solution to the inverse problem, the maximum a posteriori estimator is computed, minimizing the function in Eqn. (12) by alternating between updating x and $\theta$. It will be appreciated that other techniques known in the art can also be implemented to obtain this solution. After initialization of the weights and the dictionary (e.g., k=0, $x^{(k)}=0$, $D^{(k)}=D$), the variance vector, $\theta$, is first updated. As one example, the variance vector can be updated via an analytical solution, such as an analytical solution using simple differentiation. In this example, the kth iteration yields the updated variance as, $$\theta_j^{(k)} = \beta\left(\eta + \left(\frac{[x_j^{(k-1)}]^2}{2\beta} + \eta^2\right)^{1/2}\right); \tag{13}$$

where $\eta=(\alpha-3/2)/2$. The next step is the minimization problem in x, which, for fixed $\theta$, can be reduced to a linear least-squares problem. This can be solved using a conjugate gradient method for least squares, or any other suitable technique known in the art. As one non-limiting example, a conjugate gradient method for least squares with prior conditioning and a change of variables can be used, such as, $$w^{(k)} = \arg\min\left\{\left\|y - D^{(k-1)}[T_\theta^{(k)}]^{1/2}w\right\|^2 + \mu w^2\right\}; \tag{14}$$

where $\mu$ is a regularization parameter, which may be a regularization parameter for a Tikhonov regularization scheme, and in some instances can be related to the noise, $\sigma$. In these examples, the conjugate gradient least-squares iterations can be stopped when a stopping criterion is satisfied, such as when the difference between the residuals at the kth and (k−1)st iteration drops below a predetermined tolerance.

Then, x can be updated as, $$x^{(k)} = [T_\theta^{(k)}]^{1/2} w^{(k)} \tag{15}.$$

To further encourage sparsity and ease the computational burden, the dictionary may in some instances be trimmed after each iteration by removing the columns corresponding to the smallest weight values, $x_j$, defined using a fixed percentage (e.g., 5%) of the dictionary size, to form an updated dictionary $D^{(k+1)}$ before the next iteration proceeds. This may be advantageous for the following reasons. The MRF dictionary can grow to extremely large sizes when more parameter combinations are considered or added, and pruning the dictionary in this way can result in faster computations. As another advantage, there are groups of dictionary entries that have similar $T_1$ and $T_2$ values, which, when solving an $l_2$-minimization problem, may cause the weights to spread across these similar entries. Pruning the dictionary will allow only the most significant dictionary entries to remain in the solution of this method.

It is noted that the number of tissue types present in a given voxel is not an input into the problem, but can be inferred based on the analysis of the final output. The algorithm can be stopped based on a desired number of dictionary entries to represent the mixed voxel. This step can be important because leaving too many dictionary entries to represent a mixed voxel may leave in incorrect and noncontributing entries in the solution. However, because of the similarity between dictionary entries with $T_1$ and $T_2$ that are relatively close, running the algorithm until only a small number of dictionary entries remain may risk pruning a dictionary entry that may otherwise significantly contribute to the mixed voxel.

In practice, because of the nature of complex-valued MRF signals, the weights x can be computed as complex. In some instances, after all of the iterations have been completed, the complex value $x_j$ can be projected to the non-negative real line by considering the magnitude as the weight value.

Figure 2:
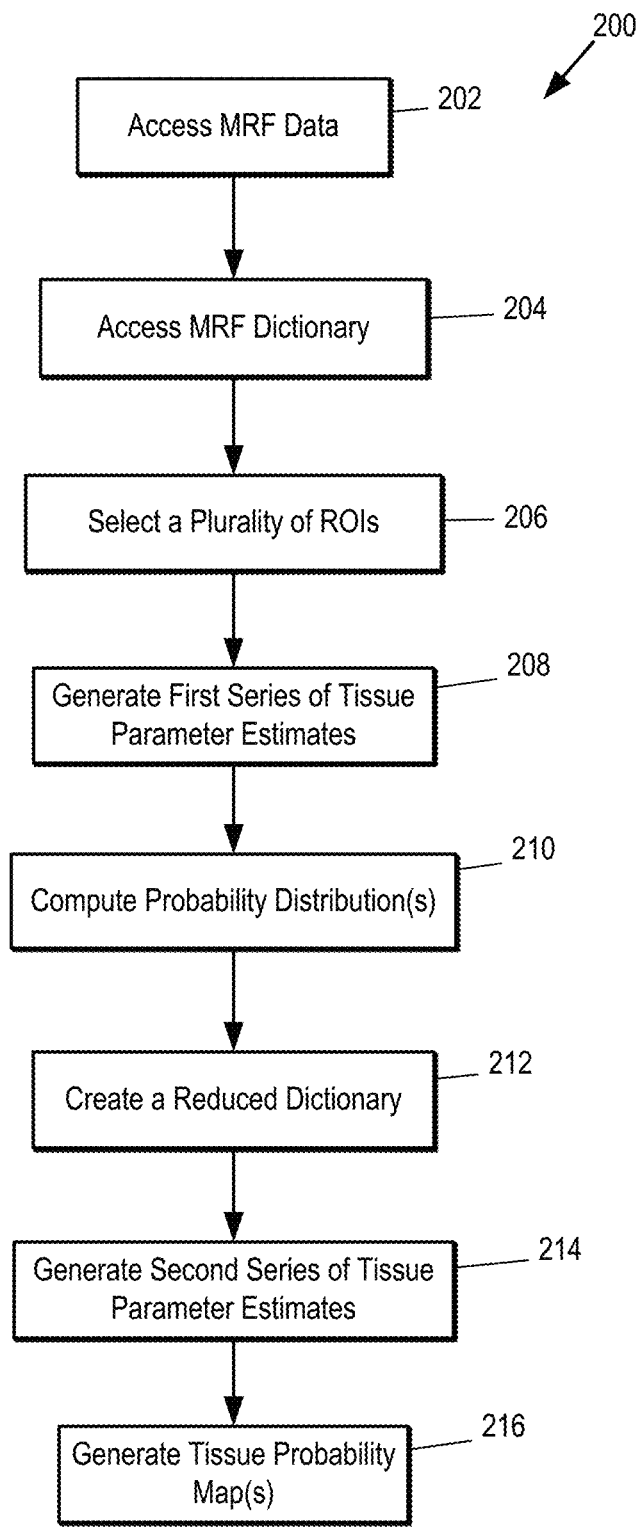
FIG. 2 is a flowchart setting forth the steps of an example for generating tissue probability maps with magnetic resonance fingerprinting ("MRF").

Referring now to FIG. 2, a flowchart is illustrated as setting forth the steps of an example method for generating tissue probability maps using magnetic resonance fingerprinting.

The method includes accessing MRF data with a computer system, as indicated at step 202. These MRF data have been acquired from a subject with an MRI system in a series of variable sequence blocks. As described above, in this manner one or more resonant species in the subject are caused to simultaneously produce individual magnetic resonance signals. In general, at least one member of the series of variable sequence blocks differs from at least one other member of the series of variable sequence blocks in at least two sequence block parameters. The MRF data can be accessed by the computer system by retrieving previously acquired MRF data from a memory or other data storage device or medium. In other instances, the MRF data can be accessed by the computer system by acquiring the MRF data with an MRI system and communicating the acquired MRF data to the computer system, which may form a part of the MRI system.

A dictionary is also accessed with the computer system, as indicated at step 204. As described above, the dictionary may include a plurality of signal evolutions corresponding to tissue types that can be found within an image slice or volume. The signal evolutions within the dictionary can be generated from simulated MRI data or actual MRI data to model tissue types. The dictionary may be accessed by retrieving a previously generated dictionary from a memory or other data storage device or medium.

A plurality of regions-of-interest (ROIs) are selected for sub-voxel analysis, as indicated at step 206. The ROIs can be chosen within an image slice or volume. As one example, an ROI can contain only a single voxel. In other examples, each ROI can contain multiple voxels. In general, a given ROI is selected such that the one or more voxels contained in the ROI correspond to a single tissue type. In other examples, a given ROI can be selected such that the one or more voxels contained in the ROI correspond to a plurality of tissue types. In these instances, a given voxel in an ROI may correspond to a single tissue type (i.e., the ROI contains multiple voxels and at least two of the voxels corresponds to different tissue types) or an admixture of tissue types (i.e., the ROI contains one or more voxels and at least one voxel contains multiple different tissue types). In the example of neuroimaging, the tissue types can include white matter, gray matter, cerebrospinal fluid ("CSF"), or combinations thereof. It will be appreciated that the systems and methods described in the present disclosure can also be implemented in other anatomical regions where different tissue types may be selected (e.g., muscle and fat; liver and fat; liver, blood, and fat).

Each of the tissue types and areas corresponding to the tissue types can have Gaussian distributions with $T_1$ and $T_2$ that are unique to their respective tissue type. For example, each of the plurality of ROIs may contain one voxel within the ROI that corresponds to pure white matter. Another ROI may contain one voxel that corresponds to pure gray matter and yet another ROI may contain one voxel that corresponds to pure CSF. As another example, each of the plurality of ROIs may contain multiple voxels within the ROI. Each of the multiple voxels can all correspond to a tissue type, such as white matter, gray matter, or CSF. Each of the multiple voxels within the ROI can also correspond to different tissue types. For instance, a set of the voxels within the ROI can correspond to white matter, while other voxels may correspond to gray matter, and another set of the voxels can correspond to CSF, all within the same ROI.

A series of tissue parameters is estimated for each ROI by inputting the dictionary and the MRF data contained within each ROI to a multicomponent Bayesian framework, such as the Bayesian framework described above, generating output at the series of tissue parameters, as indicated at step 208. As described above, the Bayesian framework generally searches for a solution that represents the voxel signal using a number of dictionary entries supported by the data. The weight vector for each potential tissue is computed using the data and prior assumptions as a guide. In this framework, unknowns are modeled as random variables with associated probability density functions. The solution to the inverse problem is a probability density referred to as the posterior distribution. Point estimates and sampling techniques can be used to compute representative solutions from the posterior distribution. Thus, inputting the dictionary and the MRF data contained within each ROI to the Bayesian framework generates output as a series of tissue parameters for each ROI. In some instances, the output may include a plurality of dictionary entries for each voxel that reasonably match the measured signal. The series of tissue parameters can therefore indicate the tissue types and their corresponding signal evolutions that are present within each of the ROIs.

Figure 3:
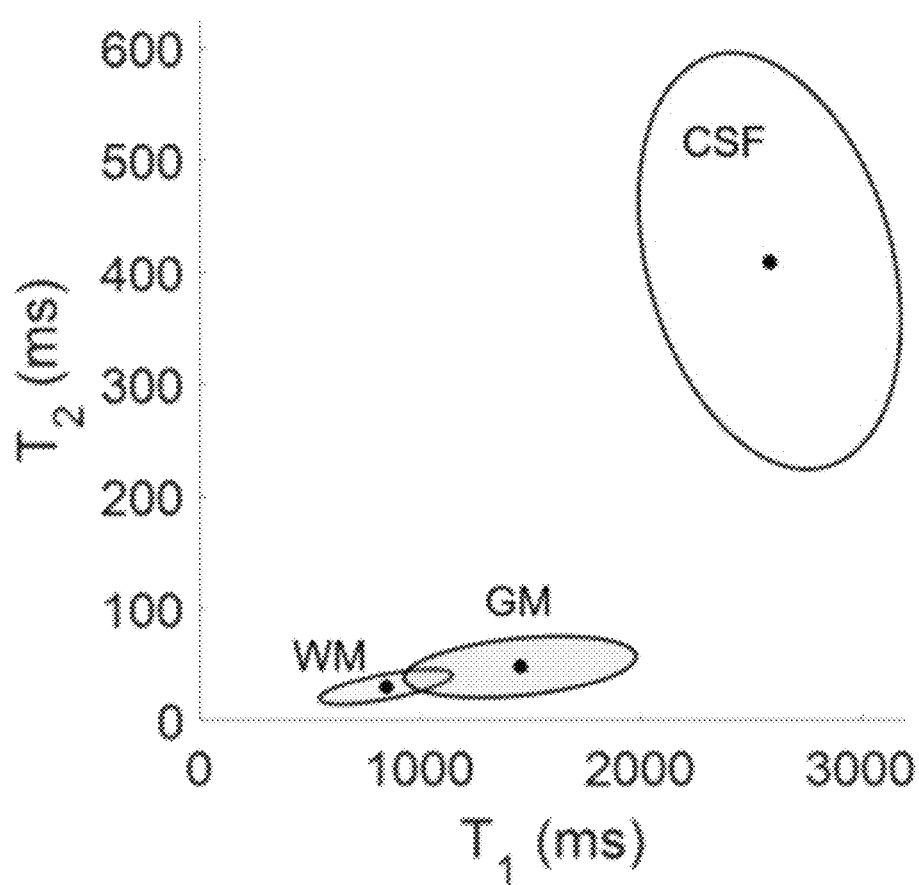
FIG. 3 illustrates credibility ellipses from pixel analysis for MRF in accordance with an embodiment.

From the estimated tissue parameters, a plurality of probability distributions are computed, as indicated at step 210. As one non-limiting example, the probability distributions can be computed by applying a Gaussian mixture model to the estimated tissue parameters to generate a number of different Gaussian probability distributions corresponding to the estimated tissue parameters. A Gaussian probability distribution is then selected for each tissue type. The probability distributions can indicate that the signal evolutions from the dictionary are related to the estimated tissue parameters and by what degree they are related. Signal evolutions from the dictionary can correspond to predefined distributions of $T_1$ and $T_2$ values found within the ROI. As an example, FIG. 3 illustrates credibility ellipses from a voxel analysis for MRF. The credibility ellipses are plotted for three Gaussian distributions derived from applying the Bayesian analysis for MRF on each of a plurality of ROIs, as described above. Each of the Gaussian distributions are unique to each image slice or volume. From the plurality of probability distributions, a different probability distribution for each desired tissue type can be selected. For instance, a probability distribution can be selected based on the maximum mixing probabilities maximum mixing probabilities of the distributions output from the Gaussian mixing model.

Using the plurality of probability distributions, a reduced dictionary is generated from the previously accessed dictionary, as indicated at step 212. As described above, the probability distributions indicate the correlation between the estimated tissue parameters and the signal evolutions of the dictionary. The reduced dictionary can be generated by removing from the dictionary those entries corresponding to signal evolutions that are not contained within the probability distributions. The resulting entries of the reduced dictionary correspond to signal evolutions related to distributions of $T_1$ and $T_2$ values that are found within the ROIs.

A second series of tissue parameters is estimated by inputting the reduced dictionary and the complete MRF data to a multicomponent Bayesian framework, such as the Bayesian framework described above, generating output as the second series of tissue parameters, as indicated at step 214. The second set of tissue parameters is indicative of tissue types present throughout the entire image slice or volume. By using the reduced dictionary, which may contain as few as one tenth of the number of entries of the original, full dictionary, the computation time for implementing the Bayesian framework to estimate tissue parameters across an entire slice or volume can be significantly reduced without compromising the signal-to-noise ratio (SNR). Additionally, the maximum probability for each dictionary entry can be saved, which indicates the distribution (e.g., the tissue type) to which the dictionary entry is most likely to belong.

Using the second series of tissue parameters, tissue probability maps are generated, as indicated at step 216. The tissue probability maps indicate a probability value for each voxel within the image slice or volume. The probability value of the tissue probability maps can be generated by a weighed sum of entries in the second series of tissue parameters at each voxel. The weighted sum of the Bayesian result from the reduced dictionary is then multiplied by one of the probability distributions for a particular tissue type. This is repeated using the different probability distributions for different tissue types, such that a tissue probability map is generated for each tissue type. The tissue probability maps are indicative of the probability of a particular voxel containing the associated tissue type.

As described above, data acquired with an MRF technique generally include data containing random measurements, pseudorandom measurements, or measurements obtained in a manner that results in spatially incoherent signals, temporally incoherent signals, or spatiotemporally incoherent signals. For instance, such data can be acquired by varying acquisition parameters from one TR period to the next, which creates a time series of signals with varying contrast. Using this series of varied sequence blocks simultaneously produces different signal evolutions in different resonant species to which RF energy is applied.

As an example, data are acquired using a pulse sequence where effectuating the pulse sequence includes controlling an NMR apparatus (e.g., an MRI system) to apply RF energy to a volume in an object being imaged. The volume may contain one or more resonant species, such as tissue, fat, and water. As one non-limiting example, the volume may contain one or more resonant species associated with gray matter, white matter, and cerebrospinal fluid.

The RF energy may be applied in a series of variable sequence blocks. Sequence blocks may vary in a number of parameters including, but not limited to, echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, type of gradient applied between a readout portion of a sequence block and an excitation portion of a sequence block, number of gradients applied between a readout portion of a sequence block and an excitation portion of a sequence block, type of gradient applied during a readout portion of a sequence block, number of gradients applied during a readout portion of a sequence block, amount of RF spoiling, and amount of gradient spoiling. Depending upon the imaging or clinical need, two, three, four, or more parameters may vary between sequence blocks. The number of parameters varied between sequence blocks may itself vary. For example, a first sequence block may differ from a second sequence block in five parameters, the second sequence block may differ from a third sequence block in seven parameters, the third sequence block may differ from a fourth sequence block in two parameters, and so on. One skilled in the art will appreciate that there are a very-large number of series of sequence blocks that can be created by varying this large number of parameters. A series of sequence blocks can be crafted so that the series have different amounts (e.g., 1%, 2%, 5%, 10%, 50%, 99%, 100%) of unique sequence blocks as defined by their varied parameters. A series of sequence blocks may include more than ten, more than one hundred, more than one thousand, more than ten thousand, and more than one hundred thousand sequence blocks. In one example, the only difference between consecutive sequence blocks may be the number or parameters of excitation pulses.

Regardless of the particular imaging parameters that are varied or the number or type of sequence blocks, the RF energy applied during a sequence block is configured to cause different individual resonant species to simultaneously produce individual NMR signals. Unlike conventional imaging techniques, in an MRF pulse sequence, at least one member of the series of variable sequence blocks will generally differ from at least one other member of the series of variable sequence blocks in at least N sequence block parameters, where N is an integer greater than one. One skilled in the art will appreciate that the signal content of a signal evolution may vary directly with N. Thus, as more parameters are varied, a potentially richer signal is retrieved. Conventionally, a signal that depends on a single parameter is desired and required to facilitate imaging. Here, acquiring signals with greater information content facilitates producing more distinct, and thus more matchable, signal evolutions.

Figure 4:
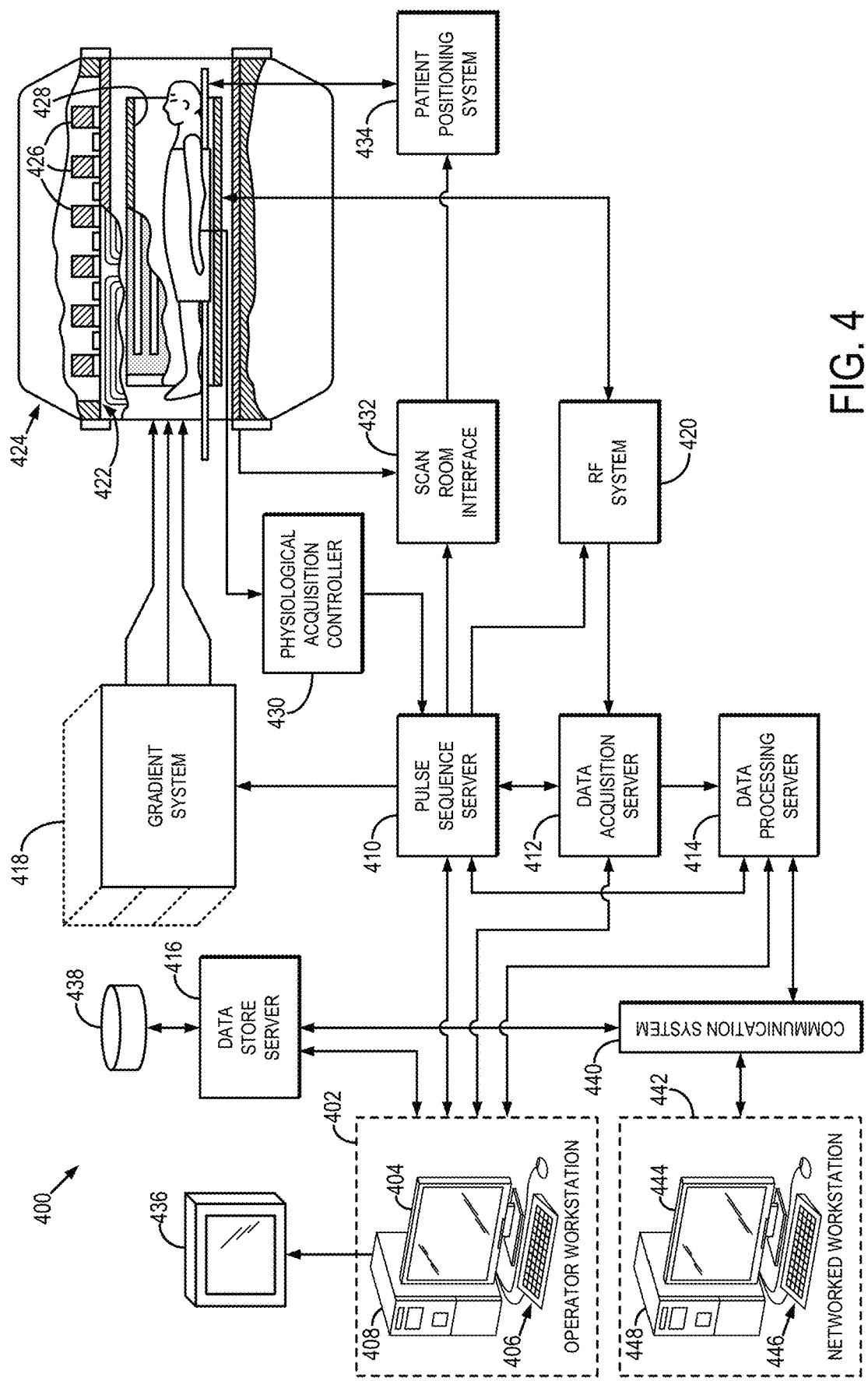
FIG. 4 is a block diagram of an example magnetic resonance imaging ("MRI") system that can implement the methods described in the present disclosure.

Referring particularly now to FIG. 4, an example of an MRI system 400 that can implement the methods described here is illustrated. The MRI system 400 includes an operator workstation 402 that may include a display 404, one or more input devices 406 (e.g., a keyboard, a mouse), and a processor 408. The processor 408 may include a commercially available programmable machine running a commercially available operating system. The operator workstation 402 provides an operator interface that facilitates entering scan parameters into the MRI system 400. The operator workstation 402 may be coupled to different servers, including, for example, a pulse sequence server 410, a data acquisition server 412, a data processing server 414, and a data store server 416. The operator workstation 402 and the servers 410, 412, 414, and 416 may be connected via a communication system 440, which may include wired or wireless network connections.

The pulse sequence server 410 functions in response to instructions provided by the operator workstation 402 to operate a gradient system 418 and a radiofrequency ("RF") system 420. Gradient waveforms for performing a prescribed scan are produced and applied to the gradient system 418, which then excites gradient coils in an assembly 422 to produce the magnetic field gradients $G_x$, $G_y$, and $G_z$ that are used for spatially encoding magnetic resonance signals. The gradient coil assembly 422 forms part of a magnet assembly 424 that includes a polarizing magnet 426 and a whole-body RF coil 428.

RF waveforms are applied by the RF system 420 to the RF coil 428, or a separate local coil to perform the prescribed magnetic resonance pulse sequence. Responsive magnetic resonance signals detected by the RF coil 428, or a separate local coil, are received by the RF system 420. The responsive magnetic resonance signals may be amplified, demodulated, filtered, and digitized under direction of commands produced by the pulse sequence server 410. The RF system 420 includes an RF transmitter for producing a wide variety of RF pulses used in MRI pulse sequences. The RF transmitter is responsive to the prescribed scan and direction from the pulse sequence server 410 to produce RF pulses of the desired frequency, phase, and pulse amplitude waveform. The generated RF pulses may be applied to the whole-body RF coil 428 or to one or more local coils or coil arrays.

The RF system 420 also includes one or more RF receiver channels. An RF receiver channel includes an RF preamplifier that amplifies the magnetic resonance signal received by the coil 428 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \qquad (16);$$

and the phase of the received magnetic resonance signal may also be determined according to the following relationship:

$$\varphi = \tan^{-1}\left(\frac{Q}{I}\right). \qquad (17)$$

The pulse sequence server 410 may receive patient data from a physiological acquisition controller 430. By way of example, the physiological acquisition controller 430 may receive signals from a number of different sensors connected to the patient, including electrocardiograph ("ECG") signals from electrodes, or respiratory signals from a respiratory bellows or other respiratory monitoring devices. These signals may be used by the pulse sequence server 410 to synchronize, or "gate," the performance of the scan with the subject's heart beat or respiration.

The pulse sequence server 410 may also connect to a scan room interface circuit 432 that receives signals from various sensors associated with the condition of the patient and the magnet system. Through the scan room interface circuit 432, a patient positioning system 434 can receive commands to move the patient to desired positions during the scan.

The digitized magnetic resonance signal samples produced by the RF system 420 are received by the data acquisition server 412. The data acquisition server 412 operates in response to instructions downloaded from the operator workstation 402 to receive the real-time magnetic resonance data and provide buffer storage, so that data is not lost by data overrun. In some scans, the data acquisition server 412 passes the acquired magnetic resonance data to the data processor server 414. In scans that require information derived from acquired magnetic resonance data to control the further performance of the scan, the data acquisition server 412 may be programmed to produce such information and convey it to the pulse sequence server 410. For example, during pre-scans, magnetic resonance data may be acquired and used to calibrate the pulse sequence performed by the pulse sequence server 410. As another example, navigator signals may be acquired and used to adjust the operating parameters of the RF system 420 or the gradient system 418, or to control the view order in which k-space is sampled. In still another example, the data acquisition server 412 may also process magnetic resonance signals used to detect the arrival of a contrast agent in a magnetic resonance angiography ("MRA") scan. For example, the data acquisition server 412 may acquire magnetic resonance data and processes it in real-time to produce information that is used to control the scan.

The data processing server 414 receives magnetic resonance data from the data acquisition server 412 and processes the magnetic resonance data in accordance with instructions provided by the operator workstation 402. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 414 are conveyed back to the operator workstation 402 for storage. Real-time images may be stored in a data base memory cache, from which they may be output to operator display 402 or a display 436. Batch mode images or selected real time images may be stored in a host database on disc storage 438. When such images have been reconstructed and transferred to storage, the data processing server 414 may notify the data store server 416 on the operator workstation 402. The operator workstation 402 may be used by an operator to archive the images, produce films, or send the images via a network to other facilities.

The MRI system 400 may also include one or more networked workstations 442. For example, a networked workstation 442 may include a display 444, one or more input devices 446 (e.g., a keyboard, a mouse), and a processor 448. The networked workstation 442 may be located within the same facility as the operator workstation 402, or in a different facility, such as a different healthcare institution or clinic.

The networked workstation 442 may gain remote access to the data processing server 414 or data store server 416 via the communication system 440. Accordingly, multiple networked workstations 442 may have access to the data processing server 414 and the data store server 416. In this manner, magnetic resonance data, reconstructed images, or other data may be exchanged between the data processing server 414 or the data store server 416 and the networked workstations 442, such that the data or images may be remotely processed by a networked workstation 442.

The present disclosure has described one or more preferred embodiments, and it should be appreciated that many equivalents, alternatives, variations, and modifications, aside from those expressly stated, are possible and within the scope of the invention.

The invention claimed is:

1. A method for magnetic resonance fingerprinting (MRF), the method comprising:
   (a) accessing with a computer system, MRF data that were acquired from a volume in a subject using an MRI system;
   (b) accessing with the computer system, a dictionary of signal evolutions;
   (c) selecting with the computer system, a plurality of regions-of-interest (ROIs) in the MRF data, wherein the ROIs correspond to different tissue types;
   (d) generating a first series of tissue parameter estimates by inputting the dictionary and the MRF data contained in the plurality of ROIs to a multicomponent Bayesian framework, generating output as tissue parameter estimates for each ROI;
   (e) computing a plurality of probability distributions from the first series of tissue parameter estimates, wherein the plurality of probability distributions comprises a probability distribution for each different tissue type;
   (f) creating a reduced dictionary by removing entries from the dictionary having tissue parameter values not contained within the computed probability distributions;
   (g) generating a second series of tissue parameter estimates by inputting the reduced dictionary and the MRF data to a multicomponent Bayesian framework, generating output as tissue parameter estimates for each voxel in the volume; and (h) generating a tissue probability map for each different tissue type from the second series of tissue parameter estimates.

2. The method of claim 1, wherein the tissue probability map for a given tissue type is generated by computing for each voxel a weighted sum of tissue parameters in the second series of tissue parameter estimates and multiplying the weighted sum by the probability distribution for the given tissue type.

3. The method as recited in claim 1, wherein computing the probability distribution for each different tissue type comprises inputting the first series of tissue parameter estimates to a Gaussian mixture model, generating output as the plurality of probability distributions.

4. The method as recited in claim 3, further comprising selecting each probability distribution for each different tissue type from the plurality of probability distributions based on a maximum mixing probability of each of the plurality of probability distributions.

5. The method as recited in claim 1, wherein step (g) includes storing a maximum probability for each dictionary entry in the reduced dictionary, wherein the maximum probability indicates the probability distribution to which a given dictionary entry is most likely to belong.

6. The method as recited in claim 1, wherein the ROIs in the plurality of ROIs each consist of a single voxel.

7. The method as recited in claim 6, wherein each ROI corresponds to a different single tissue type.

8. The method as recited in claim 6, wherein at least one ROI corresponds to a sub-voxel mixture of two or more tissue types.

9. The method as recited in claim 1, wherein the ROIs in the plurality of ROIs each comprise one or more voxels.

10. The method as recited in claim 9, wherein each ROI corresponds to a different single tissue type.

11. The method as recited in claim 9, wherein at least one ROI corresponds to a sub-voxel mixture of two or more tissue types.

12. The method of claim 1, wherein the different tissue types comprise white matter, gray matter, and cerebrospinal fluid.

13. The method as recited in claim 12, wherein at least one member of the series of variable sequence blocks differs from at least one other member of the series of variable sequence blocks in at least two sequence block parameters.

14. The method of claim 1, wherein the MRF data were acquired with the MRI system in a series of variable sequence blocks to cause one or more resonant species in the subject to simultaneously produce individual magnetic resonance signals.

* * * * *